(12) United States Patent
Chen et al.

(10) Patent No.: US 11,543,327 B2
(45) Date of Patent: Jan. 3, 2023

(54) METHOD AND APPARATUS FOR DELIVERING A THERMAL SHOCK

(71) Applicant: GM Cruise Holdings LLC, San Francisco, CA (US)

(72) Inventors: Fen Chen, Morgan Hill, CA (US); David Fain, San Francisco, CA (US); Geoffrey Maines, Oakland, CA (US); Wen-chieh Tang, San Francisco, CA (US)

(73) Assignee: GM Cruise Holdings LLC, San Francisco, CA (US)

( * ) Notice: Subject to any disclaimer, the term of this patent is extended or adjusted under 35 U.S.C. 154(b) by 452 days.

(21) Appl. No.: 16/832,213

(22) Filed: Mar. 27, 2020

(65) Prior Publication Data

US 2021/0239575 A1 Aug. 5, 2021

Related U.S. Application Data

(60) Provisional application No. 62/967,791, filed on Jan. 30, 2020.

(51) Int. Cl.
*G01R 31/28* (2006.01)
*G01M 99/00* (2011.01)

(52) U.S. Cl.
CPC ....... *G01M 99/002* (2013.01); *G01R 31/2832* (2013.01); *G01R 31/2872* (2013.01)

(58) Field of Classification Search
CPC .............................. G01J 1/42; G01R 1/06783
See application file for complete search history.

(56) References Cited

U.S. PATENT DOCUMENTS 5,916,251 A * 6/1999 Sibik ..................... F25B 49/043
62/497
2010/0224352 A1* 9/2010 Stuckey .............. H01L 23/4735
165/185

\* cited by examiner

*Primary Examiner* — Tung X Nguyen
(74) *Attorney, Agent, or Firm* — Polsinelli PC

(57) ABSTRACT

The subject disclosure relates to a system and method for testing units-under-test (UUT) with a thermal shock. The thermal shock testing system can include a chamber having an inlet and an outlet, the chamber being configured to provide a thermal shock to a unit-under-test (UUT), a pump configured to fluidly connect to the inlet of the chamber and direct a temperature controlled liquid through a channel embedded in the chamber, and a boiler and a chiller fluidly connected to the pump, the temperature of the liquid being controlled by at least one valve configured to alternatively direct hot or cold fluid to the inlet of the chamber.

20 Claims, 13 Drawing Sheets

| Components | Specification | Quantity | Note |
|---|---|---|---|
| Chiller (Cold) | -25C to 15C | 1 | SMC HRZ Series |
| Chiller (Hot) | 25C to 90C | 1 | SMC HRZ Series |
| Valve | -25C to 95C | 5 | SMC VNC Series |
| Environmental Chamber | -25C to 125C, with dry nitrogen purging gas capability | 1 | |
| Pressure Transducer | 0-1 MPa | 2 | SMC PSE Series |
| Temperature Transducer | -50C to 120C | 2 | Omega M12TXC Series |

FIG. 8

| Thermal Shock Test Parameters | Recommended Values | Note |
|---|---|---|
| Numbers | 50 cycles minimum | A physical model can be used to calculate the number of cycles for the thermal shock test. |
| Maximum Temperature | +85C (coolant temperature) | Uncontrolled humidity |
| Minimum Temperature | -25C (coolant temperature) | Uncontrolled humidity |
| Ramp Rate | < 10s | |
| Dwell Time | 30 minutes at maximum and minimum temperatures | |
| UUT ambient temperature | -20C to +50C | Dry nitrogen purging can be used during the thermal shock test for a non-condensing test. If dry nitrogen gas is not available, the chamber may need to demonstrate a non-condensing environment for UUTs during the thermal shock test. |
| UUT Power on/off | Non-operation in general | Optional operation for a lower Tmax. |

FIG. 9

METHOD AND APPARATUS FOR DELIVERING A THERMAL SHOCK

BACKGROUND

1. Technical Field

The subject technology provides solutions for testing units-under-test and in particular, for providing a thermal shock test to the units-under-test.

2. Introduction

Standard high and low temperature environmental thermal shock tests are configured to test the capability of material structure or composite materials to determine how the material withstands continuous environmental changes between extreme high temperatures and low temperatures. The thermal shock tests provide information regarding physical damages, chemical changes, and operational problems that are caused due to thermal expansion (i.e., from the heat) and contraction (i.e., from the cold) in a short period of time relative to expected operational timeframes. The thermal expansion and contraction caused by the temperature change generates stress because of the different expansion rates of the materials within the device being tested. Repeated stress causes accumulated fatigue, leading to various failure modes such as cracks and rupturing at a lower strength than the static strength. Repeated stress tests can also cause coatings to peel and screws to loosen. The thermal shock test is used in the automotive industry to simulate adaptability of units-under-test (UUT) in rapid changes of surrounding atmospheric temperature or to provide reliability test and product screening for UUT qualification and validation. The quality of the products being tested also can be controlled through this process for product improvement.

There are currently two types of thermal shock tests, air-to-air and liquid-to-liquid. The air-to-air thermal shock method is more popularly used by placing UUTs in a test chamber, which is divided into a two-chamber type dynamic shock and a three-chamber type static shock, according to the specificity of the UUT being tested. The liquid-to-liquid thermal shock method applies thermal shocks to the UUTs by alternatingly immersing the UUTs into partitioned high and low temperature liquid mediums in separate tanks. In the liquid-to-liquid thermal shock method, very high thermal ramp rates can be achieved when compared to the air-to-air thermal shock method. As such, the liquid-to-liquid thermal shock test is considered to be a more stringent thermal shock method than the air-to-air method in terms of acceleration.

Conventional methods for liquid-to-liquid thermal shock are cumbersome and inefficient. Immersion of UUTs within high and low temperature mediums requires a hoist assembly to lift UUTs and transfer the UUT between high and low temperature tanks. Transferring UUTs between tanks is labor and time intensive, especially for large UUTs. To avoid damage to sensitive electrical equipment, an entirety of an outer surface of the UUT may require water proofing. Due to the nature of thermal shock testing, water proofing material can become damaged resulting in thermal shock testing disruption or failure.

As such, a need exists for an apparatus and a method that can perform a thermal shock test more efficiently and effectively while including the benefits of a liquid-to-liquid thermal shock test.

BRIEF DESCRIPTION OF THE DRAWINGS

Certain features of the subject technology are set forth in the appended claims. However, the accompanying drawings, which are included to provide further understanding, illustrate disclosed aspects and together with the description serve to explain the principles of the subject technology. In the drawings:

FIG. 8 illustrates an example table of components of a thermal shock testing system, according to some aspects of the disclosed technology.

FIG. 9 illustrates an example table of parameters of a thermal shock testing system, according to some aspects of the disclosed technology.

DETAILED DESCRIPTION

Various examples of the present technology are discussed in detail below. While specific implementations are discussed, it should be understood that this is done for illustration purposes only. A person skilled in the relevant art will recognize that other components and configurations may be used without parting from the spirit and scope of the present technology. In some instances, well-known structures and devices are shown in block diagram form in order to facilitate describing one or more aspects. Further, it is to be understood that functionality that is described as being carried out by certain system components may be performed by more or fewer components than shown.

Faster processing speeds, increased capacity and functionality, and higher power density in autonomous vehicles (AV) produce more heat than prior generations of automobiles. As such, higher operating temperatures can rapidly outstrip the capability of air-based cooling systems. Higher operating temperatures increases the risk of reliability failures.

Liquids have a high capacity for heat transfer and can remove and dissipate heat more quickly and effectively. However, such complicated and delicate computer systems cannot simply be immersed in a liquid medium. The liquid medium would short circuit boards and irreparably damage the electronic computer systems. For example, a liquid-to-liquid thermal shock test cannot be conducted on an AV compute electrical control unit (ECU) due to its weight load and incompatibility with liquids.

The disclosed technologies address a need in the art for improvements in testing units-under-test. In some examples, a thermal shock testing system can include a chamber having a plurality of walls that is configured to provide the thermal shock to the UUT. The system further can include at least one channel being embedded within at least one wall of the plurality of walls of the chamber, wherein the at least one channel includes an inlet and an outlet. The system also can include a pump being connected to the chamber and configured to provide a liquid to the inlet of the at least one channel embedded in the chamber. The system can additional include a boiler connected to the pump and configured to provide the liquid at a high temperature. The system further can include a chiller connected to the pump and configured to provide the liquid at a low temperature. The system also can include a plurality of valves connected to the boiler and the chiller, wherein the plurality of valves is configured to control the temperature of the liquid that is pumped to the chamber.

Figure 1:
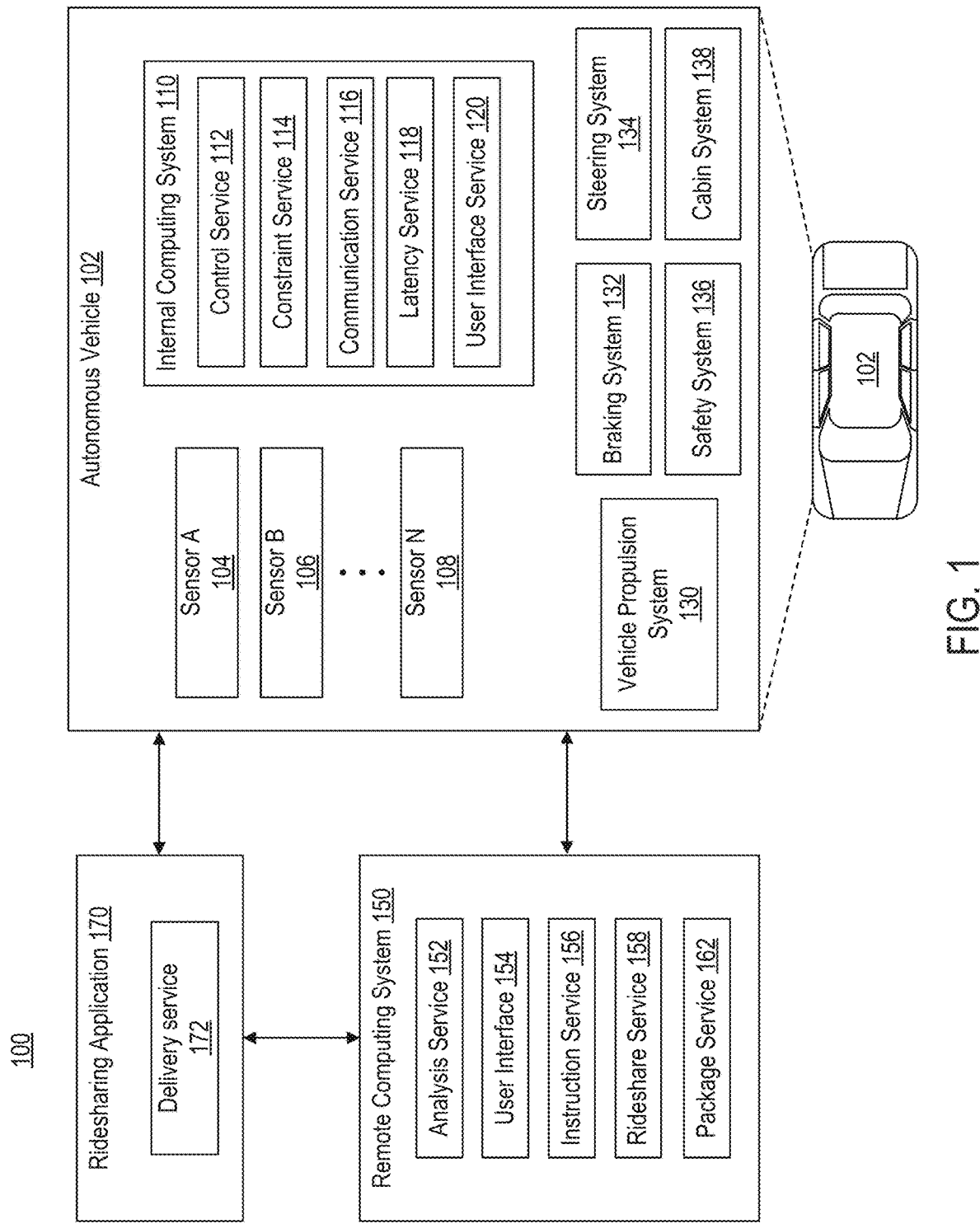
FIG. 1 illustrates an example environment that includes an autonomous vehicle in communication with a remote computing system, according to some aspects of the disclosed technology.

FIG. 1 illustrates an example autonomous vehicle environment 100. The example autonomous vehicle environment 100 includes an autonomous vehicle 102, a remote computing system 150, and a ridesharing application 170. The autonomous vehicle 102, remote computing system 150, and ridesharing application 170 can communicate with each other over one or more networks, such as a public network (e.g., a public cloud, the Internet, etc.), a private network (e.g., a local area network, a private cloud, a virtual private network, etc.), and/or a hybrid network (e.g., a multi-cloud or hybrid cloud network, etc.).

The autonomous vehicle 102 can navigate about roadways without a human driver based on sensor signals generated by sensors 104-108 on the autonomous vehicle 102. The sensors 104-108 on the autonomous vehicle 102 can include one or more types of sensors and can be arranged about the autonomous vehicle 102. For example, the sensors 104-108 can include, without limitation, one or more inertial measuring units (IMUs), one or more image sensors (e.g., visible light image sensors, infrared image sensors, video camera sensors, surround view camera sensors, etc.), one or more light emitting sensors, one or more global positioning system (GPS) devices, one or more radars, one or more light detection and ranging sensors (LIDARs), one or more sonars, one or more accelerometers, one or more gyroscopes, one or more magnetometers, one or more altimeters, one or more tilt sensors, one or more motion detection sensors, one or more light sensors, one or more audio sensors, etc. In some implementations, sensor 104 can be a radar, sensor 106 can be a first image sensor (e.g., a visible light camera), and sensor 108 can be a second image sensor (e.g., a thermal camera). Other implementations can include any other number and type of sensors.

The autonomous vehicle 102 can include several mechanical systems that are used to effectuate motion of the autonomous vehicle 102. For instance, the mechanical systems can include, but are not limited to, a vehicle propulsion system 130, a braking system 132, and a steering system 134. The vehicle propulsion system 130 can include an electric motor, an internal combustion engine, or both. The braking system 132 can include an engine brake, brake pads, actuators, and/or any other suitable componentry configured to assist in decelerating the autonomous vehicle 102. The steering system 134 includes suitable componentry configured to control the direction of movement of the autonomous vehicle 102 during navigation.

The autonomous vehicle 102 can include a safety system 136. The safety system 136 can include lights and signal indicators, a parking brake, airbags, etc. The autonomous vehicle 102 can also include a cabin system 138, which can include cabin temperature control systems, in-cabin entertainment systems, etc.

The autonomous vehicle 102 can include an internal computing system 110 in communication with the sensors 104-108 and the systems 130, 132, 134, 136, and 138. The internal computing system 110 includes one or more processors and at least one memory for storing instructions executable by the one or more processors. The computer-executable instructions can make up one or more services for controlling the autonomous vehicle 102, communicating with remote computing system 150, receiving inputs from passengers or human co-pilots, logging metrics regarding data collected by sensors 104-108 and human co-pilots, etc.

The internal computing system 110 can include a control service 112 configured to control operation of the vehicle propulsion system 130, the braking system 132, the steering system 134, the safety system 136, and the cabin system 138. The control service 112 can receive sensor signals from the sensors 104-108 can communicate with other services of the internal computing system 110 to effectuate operation of the autonomous vehicle 102. In some examples, control service 112 may carry out operations in concert with one or more other systems of autonomous vehicle 102.

The internal computing system 110 can also include a constraint service 114 to facilitate safe propulsion of the autonomous vehicle 102. The constraint service 116 includes instructions for activating a constraint based on a rule-based restriction upon operation of the autonomous vehicle 102. For example, the constraint may be a restriction on navigation that is activated in accordance with protocols configured to avoid occupying the same space as other objects, abide by traffic laws, circumvent avoidance areas, etc. In some examples, the constraint service 114 can be part of the control service 112.

The internal computing system 110 can also include a communication service 116. The communication service 116 can include software and/or hardware elements for transmitting and receiving signals to and from the remote computing system 150. The communication service 116 can be configured to transmit information wirelessly over a network, for example, through an antenna array or interface that provides cellular (long-term evolution (LTE), 3rd Generation (3G), 5th Generation (5G), etc.) communication.

In some examples, one or more services of the internal computing system 110 are configured to send and receive communications to remote computing system 150 for reporting data for training and evaluating machine learning algorithms, requesting assistance from remote computing system 150 or a human operator via remote computing system 150, software service updates, ridesharing pickup and drop off instructions, etc.

The internal computing system 110 can also include a latency service 118. The latency service 118 can utilize timestamps on communications to and from the remote computing system 150 to determine if a communication has been received from the remote computing system 150 in time to be useful. For example, when a service of the internal computing system 110 requests feedback from remote computing system 150 on a time-sensitive process, the latency service 118 can determine if a response was timely received from remote computing system 150, as information can quickly become too stale to be actionable. When the latency service 118 determines that a response has not been received within a threshold period of time, the latency service 118 can enable other systems of autonomous vehicle 102 or a passenger to make decisions or provide needed feedback.

The internal computing system 110 can also include a user interface service 120 that can communicate with cabin system 138 to provide information or receive information to a human co-pilot or passenger. In some examples, a human co-pilot or passenger can be asked or requested to evaluate and override a constraint from constraint service 114. In other examples, the human co-pilot or passenger may wish to provide an instruction to the autonomous vehicle 102 regarding destinations, requested routes, or other requested operations.

As described above, the remote computing system 150 can be configured to send and receive signals to and from the autonomous vehicle 102. The signals can include, for example and without limitation, data reported for training and evaluating services such as machine learning services, data for requesting assistance from remote computing system 150 or a human operator, software service updates, rideshare pickup and drop off instructions, etc.

The remote computing system 150 can include an analysis service 152 configured to receive data from autonomous vehicle 102 and analyze the data to train or evaluate machine learning algorithms for operating the autonomous vehicle 102. The analysis service 152 can also perform analysis pertaining to data associated with one or more errors or constraints reported by autonomous vehicle 102.

The remote computing system 150 can also include a user interface service 154 configured to present metrics, video, images, sounds reported from the autonomous vehicle 102 to an operator of remote computing system 150, maps, routes, navigation data, notifications, user data, vehicle data, software data, and/or any other content. User interface service 154 can receive, from an operator, input instructions for the autonomous vehicle 102.

The remote computing system 150 can also include an instruction service 156 for sending instructions regarding the operation of the autonomous vehicle 102. For example, in response to an output of the analysis service 152 or user interface service 154, instructions service 156 can prepare instructions to one or more services of the autonomous vehicle 102 or a co-pilot or passenger of the autonomous vehicle 102.

The remote computing system 150 can also include a rideshare service 158 configured to interact with ridesharing applications 170 operating on computing devices, such as tablet computers, laptop computers, smartphones, head-mounted displays (HMDs), gaming systems, servers, smart devices, smart wearables, and/or any other computing devices. In some cases, such computing devices can be passenger computing devices. The rideshare service 158 can receive from passenger ridesharing app 170 requests, such as user requests to be picked up or dropped off, and can dispatch autonomous vehicle 102 for a requested trip.

The rideshare service 158 can also act as an intermediary between the ridesharing app 170 and the autonomous vehicle 102. For example, rideshare service 158 can receive from a passenger instructions for the autonomous vehicle 102, such as instructions to go around an obstacle, change routes, honk the horn, etc. The rideshare service 158 can provide such instructions to the autonomous vehicle 102 as requested.

The remote computing system 150 can also include a package service 162 configured to interact with the ridesharing application 170 and/or a delivery service 172 of the ridesharing application 170. A user operating ridesharing application 170 can interact with the delivery service 172 to specify information regarding a package to be delivered using the autonomous vehicle 102. The specified information can include, for example and without limitation, package dimensions, a package weight, a destination address, delivery instructions (e.g., a delivery time, a delivery note, a delivery constraint, etc.), and so forth.

The package service 162 can interact with the delivery service 172 to provide a package identifier to the user for package labeling and tracking. Package delivery service 172 can also inform a user of where to bring their labeled package for drop off. In some examples, a user can request the autonomous vehicle 102 come to a specific location, such as the user's location, to pick up the package. While delivery service 172 has been shown as part of the ridesharing application 170, it will be appreciated by those of ordinary skill in the art that delivery service 172 can be its own separate application.

One beneficial aspect of utilizing autonomous vehicle 102 for both ridesharing and package delivery is increased utilization of the autonomous vehicle 102. Instruction service 156 can continuously keep the autonomous vehicle 102 engaged in a productive itinerary between rideshare trips by filling what otherwise would have been idle time with productive package delivery trips.

Embodiments include an apparatus and a method that perform a thermal shock test such that the unit-under-test (UUT) (e.g., a computer or an autonomous vehicle (AV) component) can function during and after abrupt and rapid fluctuations in temperature without experiencing degradation and loss in function.

Figure 2:
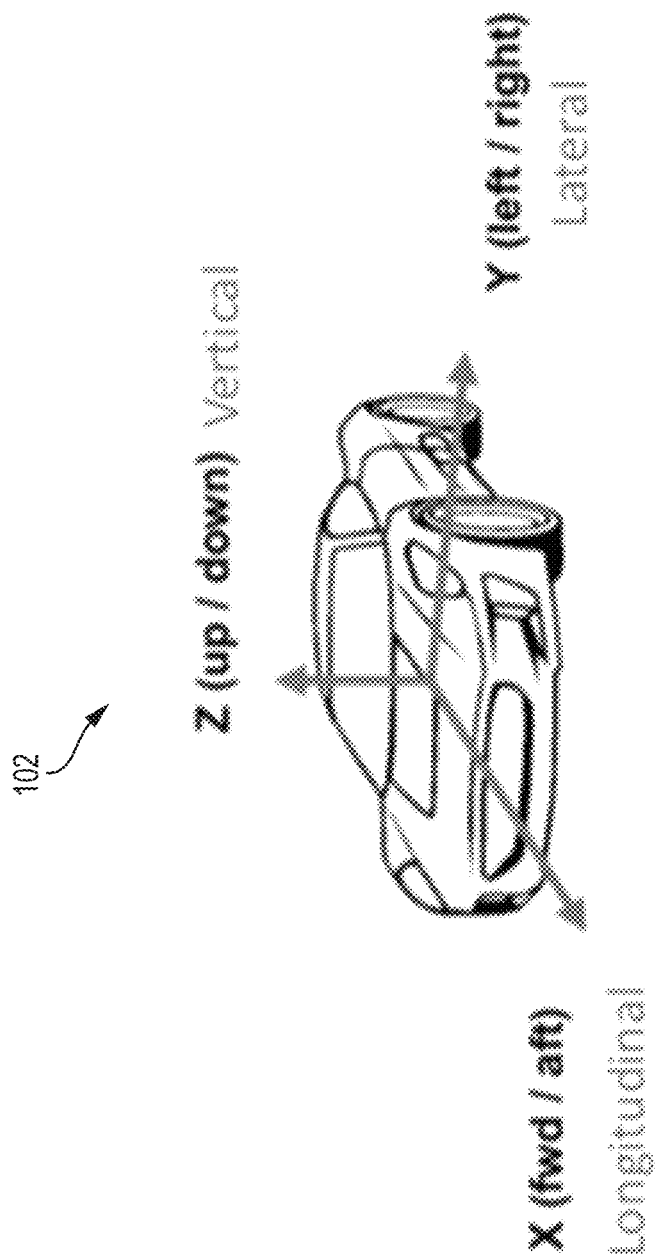
FIG. 2 illustrates a perspective view of an autonomous vehicle, according to some aspects of the disclosed technology.

FIG. 2 illustrates a perspective view of an autonomous vehicle, according to some aspects of the disclosed technology. FIG. 2 further illustrates 3D axes including a Z-axis (up/down/vertical), an X-axis (fwd/aft/longitudinal), and a Y-axis (left/right/lateral).

UUT Placement Orientation:

UUT's in-test placement can mimic in-vehicle orientation, mounting condition, and frequency response characteristics. For example, in AV compute testing, UUTs can be placed approximately 19 degrees along the vertical Z-axis direction.

Inspection and Measurement for Reliability Testing:

UUTs can proceed through diagnostic checks including functional and cosmetic inspections before, during, and after testing to measure degradation in performance or catastrophic failures.

Cosmetic inspection can include visually inspecting the UUT for variations in plastic and metal color, surface finish, gaps between adjacent features, signs of cracking, rupturing, screw loosening, deformation, warpage, corrosion, delamination, scratches, dents, bulges, bubbles, peeling, and any other variation suitable for the intended purpose and understood by a person of ordinary skill in the art.

Functional Test can include a functional/parametric check to determine whether the UUT is functional. Functionality of input/output (I/O) connectors and mechanical moving parts can be checked.

Dimensional checks can include performing a visual inspection and measuring gap/flush dimensions using a coordinate measuring machine (CMM) or a pair of calipers.

Pass/Fail Criteria:

The UUT can be considered as "passing" if it meets cosmetic, dimensional, and functionality requirements during the test. For example, functional failures and mechanical damage are typically not allowed. In other embodiments, a certain level of cosmetic damage and/or dimensional change can be acceptable pending on an engineering risk assessment.

Reliability Test Report:

A reliability engineer also can provide a test report template that can be used as an overall summary of the test results. The reliability engineer executing the reliability test plan can generate data sheets to document objective and subjective data collected throughout the test. Updated reports can be sent to the reliability engineer every week or more frequently as test milestones are reached. All results can be reported as numerical values whenever possible. Test reports can include:
1) Results of pre-test, mid-test, and post-test cosmetic inspections, dimensional checks, and functional test logs. Pictures of cosmetic anomalies and dimensional changes also can be included.
2) Report pass/fail status of samples.
3) Photographs of the test setup including photos of the sample orientation in the chamber or dynamic fixture.
4) Photograph the sample before and after each test procedure.
5) Chamber logs (e.g., temperature and humidity as-run profiles).

FIGS. 3A-6 illustrate example schematic diagrams and perspective views of an example thermal shock testing system 300, according to some aspects of the disclosed technology.

Reliability Test Procedure and Requirements:

Embodiments of the thermal shock testing system 300 can include a chiller 302 (with cold coolant), a chiller/boiler 304 (with warm coolant), a chamber 306, and a coldplate 308 or a thermally sealed box. In some instances, the thermal shock testing system 300 also can include circulating, alternatingly, cold coolant from the chiller 302 and warm coolant from the boiler 304 through the coldplate 308 to form a fast temperature change environment within the enclosure/chamber 306. Such a temperature change environment induced by the cold and hot coolants can mimic a field condition more realistically. In addition to the temperature change, internal pressures of the liquid pipe and the heat pipe can be cyclically changed due to the fast temperature change.

Example schematic and perspective setups of the liquid-to-liquid thermal shock testing system 300 are illustrated in FIGS. 3A-6 along with a hot/cold liquid input control algorithm. For example, a thermal cycling (dT) of −25 degrees Celsius to 85 degrees Celsius or larger dT can be used for testing solder joints, PCBs, and electrical connections. The minimum and maximum temperature values can be modified depending on the UUT and at the discretion of the reliability engineer.

In some instances, the thermal shock testing system 300 can include a chamber 306 having an inlet 310, an outlet 312, and a coldplate 308, a plurality of valves 314, a pump 316, a chiller (cold) 302, and a chiller (hot) 304. The chamber 306 can include a plurality of walls including a top wall 318, a bottom wall 320, and sidewalls 322. In some instances, the bottom wall 320 can be the coldplate 308.

In other instances, the chamber 306 and/or the coldplate 308 of the thermal shock testing system 300 can include at least one channel 324 that facilitates the cold/hot liquid to flow from the inlet 310 to the outlet 312 of the thermal shock testing system 300. The at least one channel 324 can be a channel, a cavity, a tube, a coil, a thermal coil or any other channel suitable for the intended purpose and understood by a person of ordinary skill in the art.

Figure 5:
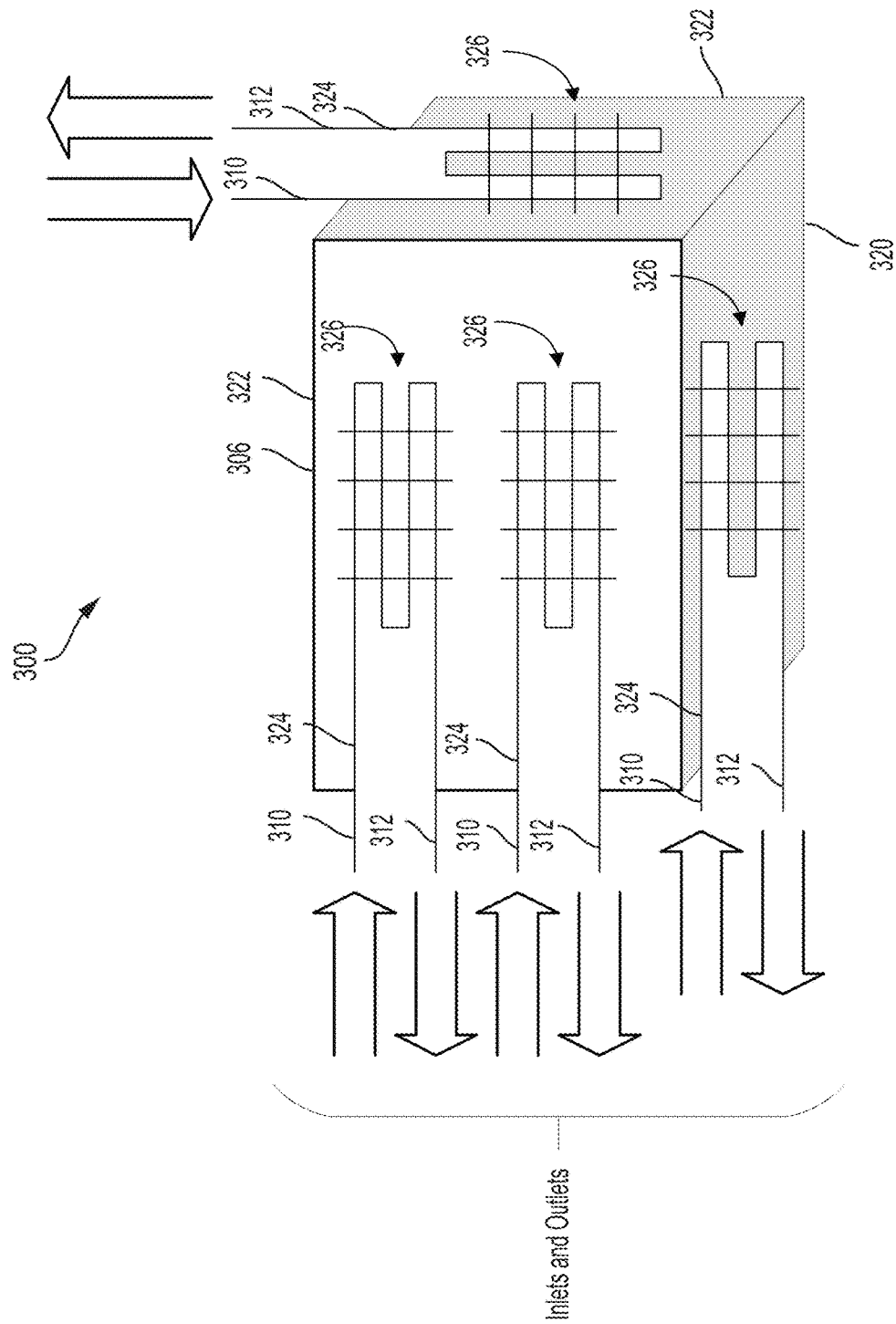
FIG. 5 illustrates a perspective view of an example thermal shock testing system, according to some aspects of the disclosed technology.

The thermal shock testing system 300 can further include a plurality of channels 324 in the plurality of walls 318, 320, 322 of the chamber 306 and the coldplate 308 with corresponding inlets 310 and outlets 312 to provide various temperature regions throughout the walls 318, 320, 322 of the chamber 306 and the coldplate 308, as shown in FIG. 5. In some cases, the channels 324 can form thermal coils 326 in various regions of the chamber 306 and the coldplate 308. The thermal coils 326 can be planar (as illustrated in FIG. 5) or non-planar to the walls 318, 320, 322 of the chamber 306 and the coldplate 308. For example, in FIG. 5, two thermal coils 326 are provided in one side wall 322, while one thermal coil is provided in another side wall 322 and the bottom wall 320/coldplate 308. In other instances, different configurations including thermal coils 326 in the top wall 318 of the chamber 306 and a varying number of thermal coils 326 in the plurality of walls 318, 320, 322 and the coldplate 308 are contemplated in this disclosure. Various quadrants of the walls 318, 320, 322 of the chamber 306 and/or the coldplate 308 can also have different temperatures based on the arrangement of the plurality of channels 324 in the system 300 so that a single UUT or multiple UUTs can experience different temperatures at the same time.

The thermal shock testing system 300 also can be a "chamber in a chamber" thermal shock testing system 300. For example, one chamber 306 can be positioned within another chamber 306 such that both chambers 306 are capable of providing a thermal shock test to a UUT. The coldplate 308 can serve as an independent thermal shock chamber to test the UUT, while also being inside the chamber 306 having an alternating cold and hot liquid circulation. Heat can be transferred by the liquid, instead of by the air, without having to move the UUT. The chamber 306 of the thermal shock testing system 300 can be an outer environmental chamber that includes an independent temperature control that can mimic a car being outside use-type environment.

In further instances, the thermal shock testing system 300 can further include a flow meter (FM) 328 to determine the flow rate of the liquid in the thermal shock testing system 300.

In some instances, a temperature transducer (T) 330 and a pressure transducer (P) 332 can be positioned at an inlet of a source connector 334 and at an outlet of a return connector 336 of a device-under-test (DUT) of the thermal shock testing system 300. The DUT may be similar to or the same as the UUT.

In other instances, the plurality of valves 314 of the thermal shock testing system 300 can include a hot source valve 338, a hot return valve 340, a cold source valve 342, and a cold return valve 344. The thermal shock testing system 300 also can include a bypass valve 346 that can be positioned between the input of the temperature transducer 330 and pressure transducer 332 of the source connector 334 and the output of the temperature transducer 330 and pressure transducer 332 of the return connector 336. The bypass valve 346 can maintain the temperature in piping when the DUT is not connected, which can allow continuous running of the chillers 302, 304 to maximize up-time.

In another instance, the thermal shock testing system 300 can include an in-line filter 348 at the DUT return along with a different pressure sensor (dP) 332 to evaluate when the system 300 is clogged.

In some embodiments, fasteners can be used to secure the DUT to the chamber 306/coldplate 308 of the thermal shock testing system 300. For example, the fasteners can be used along a perimeter of the DUT to secure the DUT in a particular location of the chamber 306/coldplate 308. The fasteners can include magnets, latches, inserts, screws, tie downs, or any other fastener suitable for the intended purpose and understood by a person of ordinary skill in the art. Furthermore, the fasteners may be repositionable along the chamber 306/coldplate 308 of the thermal shock testing system 300. For example, if the DUT is to be positioned in a different position, the fasteners can be moved to secure the DUT in the new position. Moreover, if a new DUT is to be tested, the fasteners can be repositioned to the perimeter of the new DUT. In some instances, the DUT can be placed on top of the fasteners depending on the testing parameters.

Figure 6:
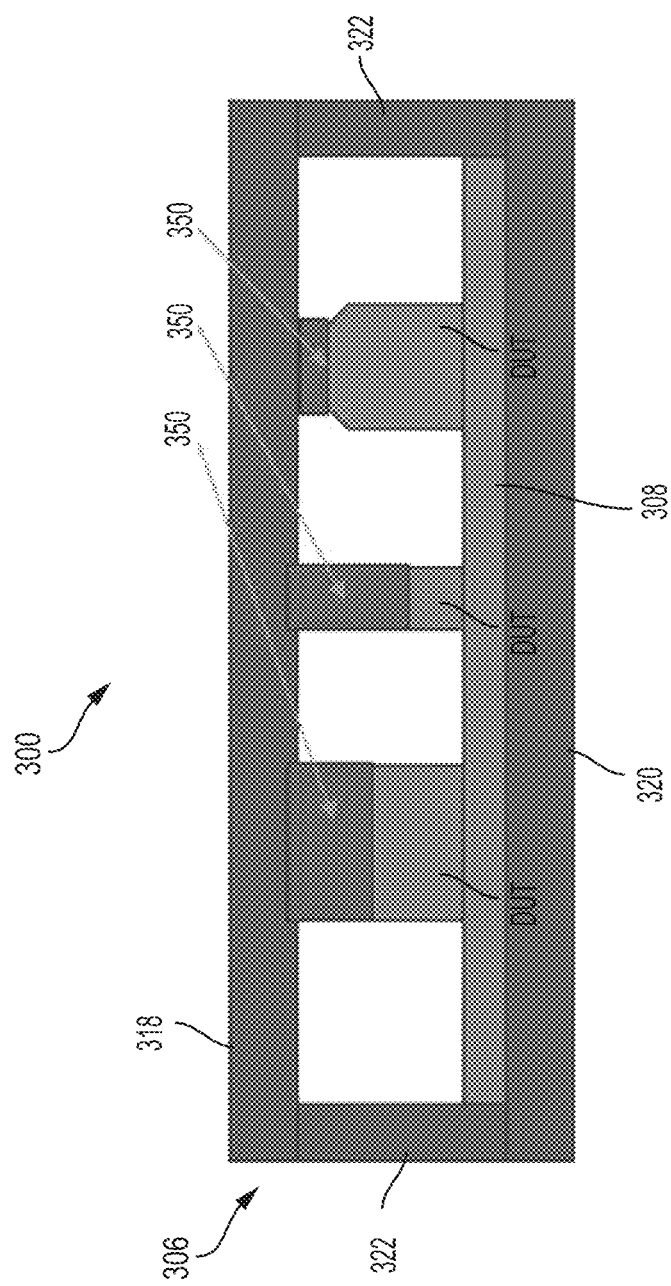
FIG. 6 illustrates a cross-sectional side view of a chamber of an example thermal shock testing system, according to some aspects of the disclosed technology.

In other instances, the fasteners of the thermal shock testing system can be pedestals 350 as shown in FIG. 6. The pedestals 350 can be configurable, thermally conductive pedestals that are positionable within the interior portion of the coldplate 308/chamber 306 of the thermal shock testing system 300. The pedestals 350 further can be independent of the coldplate 308/chamber 306 of the thermal shock testing system 300. The thermally conductive pedestals 350 can be made of metals with high thermal conductivity such as aluminum, copper, brass, steel, bronze, or any other metal with high thermal conductivity that is suitable for the intended purpose and understood by a person of ordinary skill in the art.

In some instances, a DUT can include "hot" components that are operational and that are positioned on a substrate, printed circuit board (PCB), or a motherboard. The substrate or motherboard can be thermally connected to the coldplate 308 or the bottom plate of the chamber 306 of the thermal shock testing system 300. Furthermore, the pedestals 350 can thermally connect the plate wall (e.g., top plate 318 or side walls 322) of the chamber 306 to the surfaces of the "hot" components of the DUT that are positioned on the substrate/motherboard to provide a secondary path of thermal distribution.

Furthermore, the pedestals 350 can be positioned adjacent to "hot" components (e.g., one or more processors) as targeted components as shown in FIG. 6. The targeted components typically produce a greater thermal output than other components on the motherboard when the components are operating in their normal capacity. By targeting "hot" components on the substrate/motherboard with the pedestals 350, components having a greater thermal range during operation are subject to a greater thermal range during a thermal shock test. Thus, by targeting "hot" components, the thermal shock testing system 300 can more accurately simulate a thermal stress that the DUT experiences during operation than conventional thermal stress techniques.

Figure 3A:
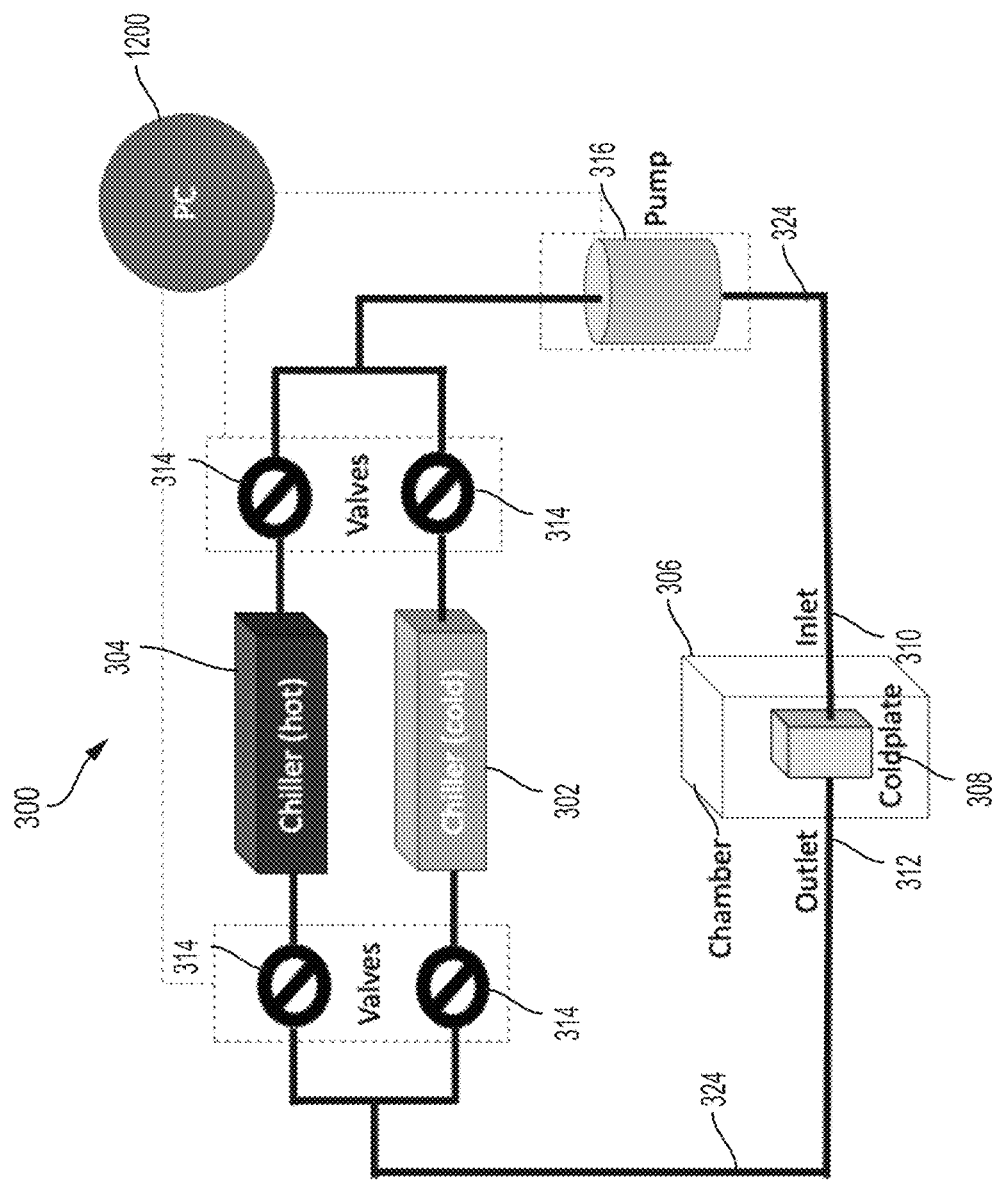
FIG. 3A illustrates an example schematic diagrams of a thermal shock testing system, according to some aspects of the disclosed technology.
Figure 3B:
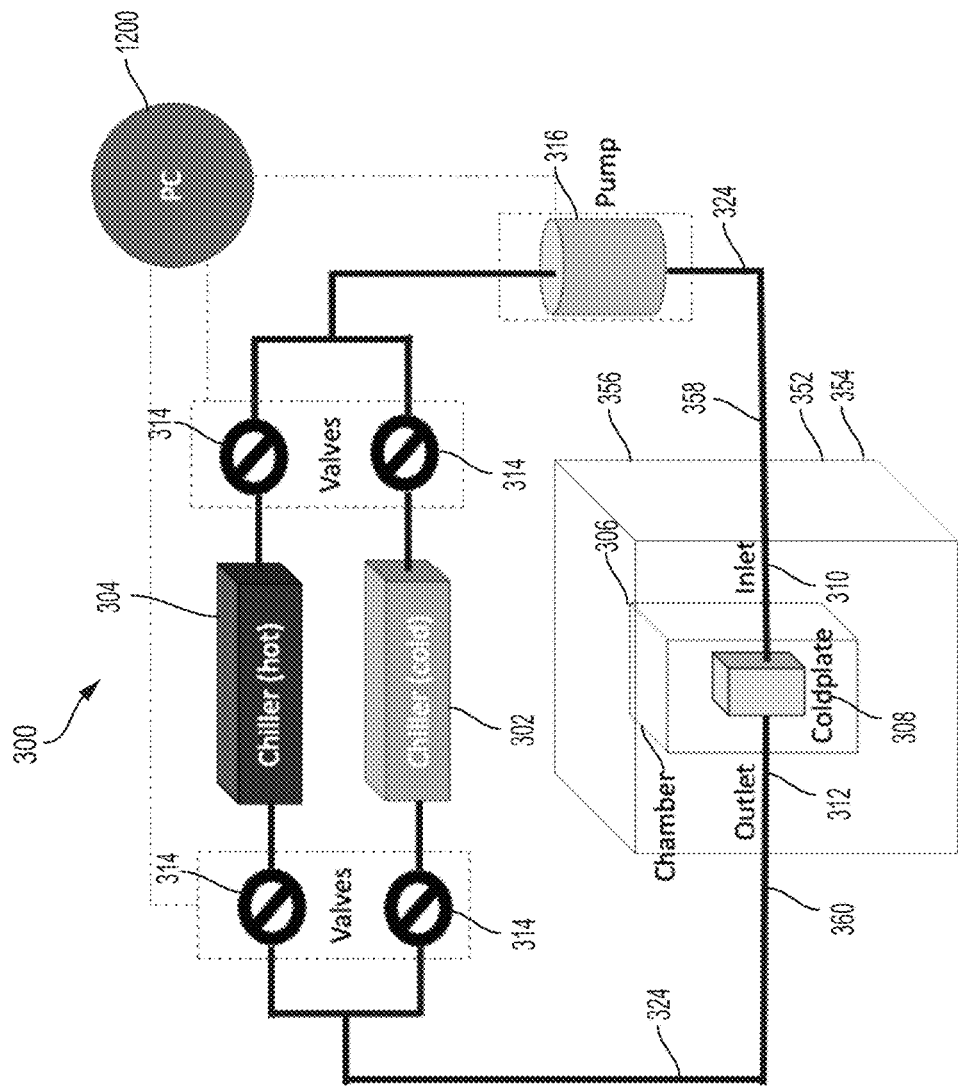
FIG. 3B illustrates an example schematic diagrams of a thermal shock testing system, according to some aspects of the disclosed technology.

In some instances, the liquid-to-liquid thermal shock testing system 300 can be coupled with a liquid cooling system (LCS) 352, which can be integrated with a unit-under-test (UUT) 354, as shown in FIG. 3B. For example, the liquid-to-liquid thermal shock testing system 300 can be configured to couple with the LCS 352, which can be integrated into an outer casing 356 of the UUT 354.

The outer casing 356 of the UUT 354 can include channels (similar to the channels 324) that can be embedded within and traverse throughout the outer casing 356 of the UUT 354. The channels of the LCS 352 can be fluidly coupled to the channels 324 of the liquid-to-liquid thermal shock testing system 300 such that the temperature regulated fluid from the liquid-to-liquid thermal shock testing system 300 can be utilized by the channels of the LCS 352. In some instances, the liquid-to-liquid thermal shock testing system 300 can be fluidly coupled to an inlet 310 and an outlet 312 of the LCS 352. As provided above, the liquid-to-liquid thermal shock testing system 300 can direct temperature regulated fluid into the LCS 352 to conduct a thermal shock test on components adjacent to coldplate(s) 308.

In other instances, the channels of the LCS 352 further can be proximate (e.g., adjacent) to the coldplate(s) 308 to regulate the coldplate(s) 308. An interior portion of a wall of the outer casing 356 can include one or more coldplate(s) (e.g., the coldplate 308). In some cases, the interior region within the outer casing 356 can be or include the chamber 306 of the liquid-to-liquid thermal shock testing system 300. Furthermore, the coldplate(s) 308 can be proximate (e.g., adjacent) to components of a computer (e.g., one or more processors).

The LCS 352 also can house and thermally regulate electrical components, processors, memory, or any other component suitable for the intended purpose and understood by a person of ordinary skill in the art. The thermal shock testing system 300 of the LCS 352 not only can provide a thermal shock test to components, the LCS 352 can also thermally regulate the UUT 354 by controlling the temperature of the liquid passing through the channels 324 of the thermal testing system 300 and the channels of the LCS 352, and by utilizing the thermal conductive properties of the pedestals 350.

In some cases, the LCS 352 can comprise optimized system components, such as pumps 316, cold plates 308, pedestals 350, and heat pipes 324 that may be pre-configured to cool high-power density devices of an autonomous vehicle. For example, the LCS 352 can include cold plates 308 that are proximate to key components within a UUT/DUT as shown in FIG. 6. By leveraging the LCS 352 to perform the liquid-to-liquid thermal shock test, key components within the UUT/DUT can be more directly targeted than with conventional liquid-to-liquid cooling test techniques.

In some instances, the LCS 352 can be utilized to cool a compute during normal operation (i.e., when the computer is running during AV operation). The LCS 352 can include piping/channels that are integrated in the casing/walls 318, 320, 322 of the compute. The casing of the compute can include conductive layers (e.g., pedestals 350 as shown in FIG. 6) that can be positioned proximate to components (e.g., "hot" processors) on one side and in contact with the casing having piping/channels on the other side. Thus, during normal operation, the LCS 352 can maintain the components at an optimal or selected temperature range.

Thermal interface material or soldering can be utilized to facilitate the thermal connection between the pedestals 350 and the DUT to improve a temperature transition of the DUT that is positioned within the interior portion of the coldplate 308/chamber 306 of the thermal shock testing system 300. Examples of the thermal interface material can include a thermal grease, a thermal adhesive, a thermal gap filler, a thermally conductive pad, thermal tape, phase-change materials, or any other thermal interface material suitable for the intended purpose and understood by a person of ordinary skill in the art.

Figure 7:
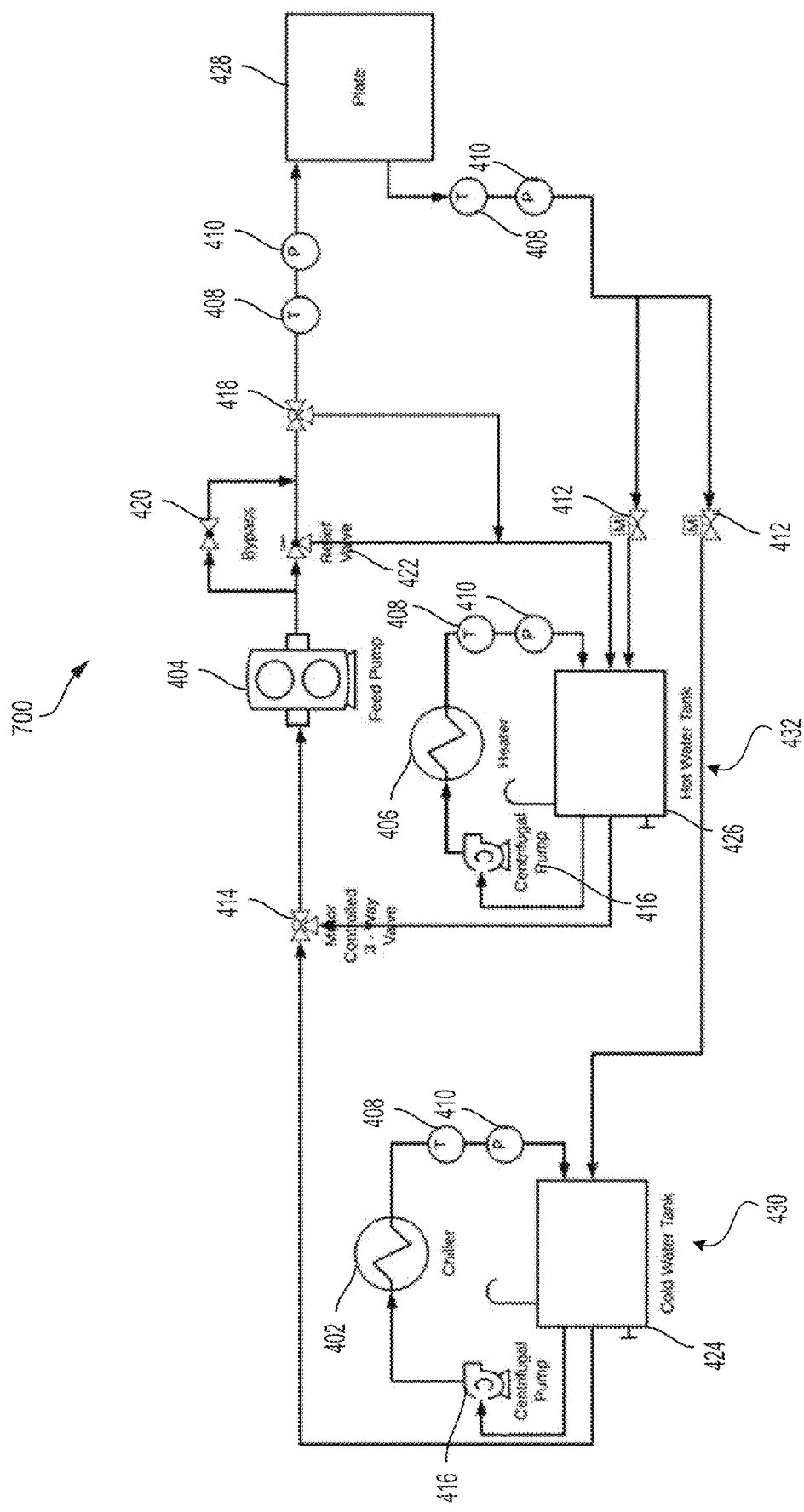
FIG. 7 illustrates an example schematic diagram of a thermal shock testing system, according to some aspects of the disclosed technology.

FIG. 7 illustrates an example schematic diagram of a thermal shock testing system, according to some aspects of the disclosed technology.

Figure 4:
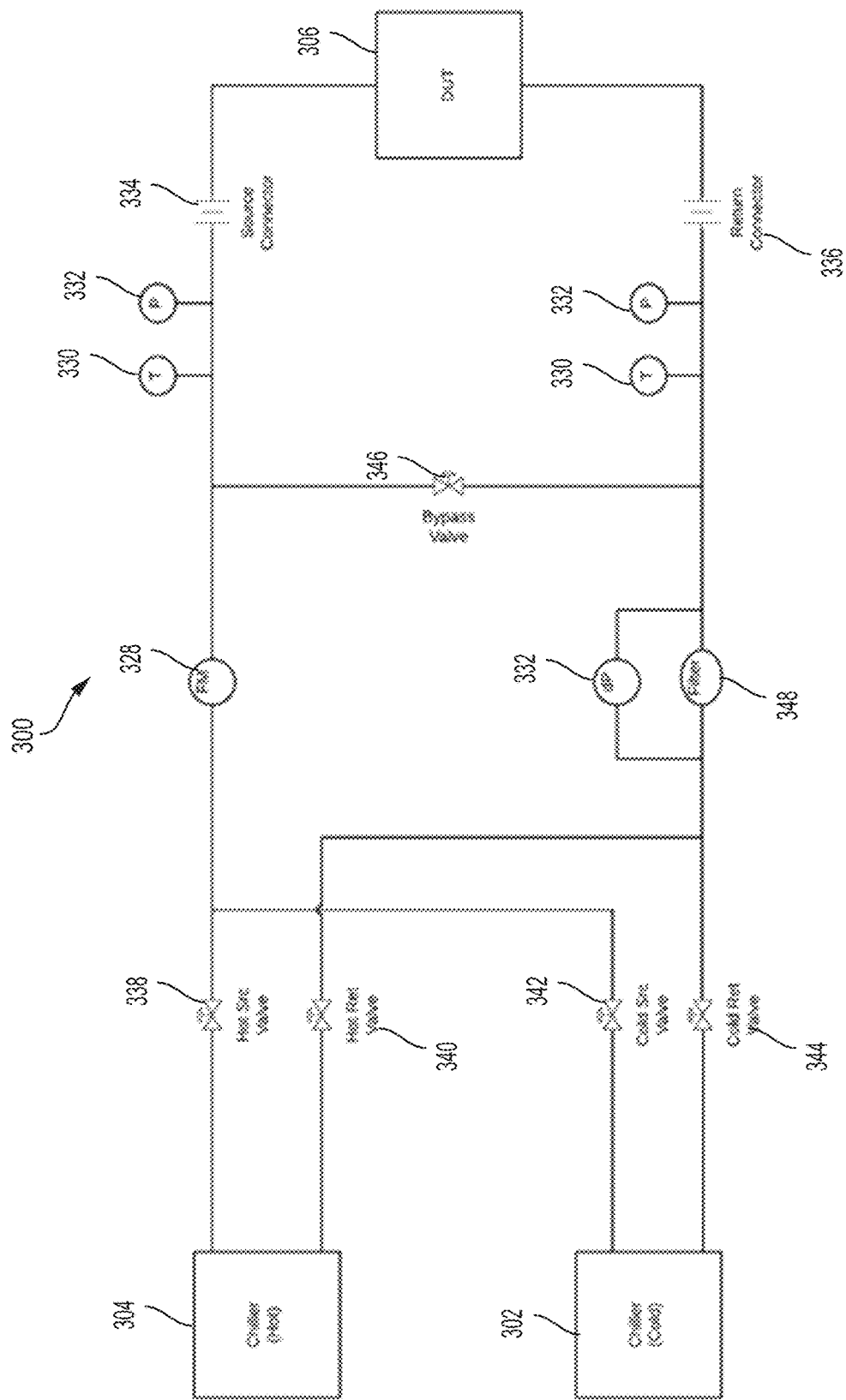
FIG. 4 illustrates an example schematic diagrams of a thermal shock testing system, according to some aspects of the disclosed technology.

In some instances, similar to the thermal shock testing system 300 of FIG. 4, a thermal shock testing system 700 can include a chiller 402, a feed pump 404, a heater 406, temperature 408 and pressure 410 implementation (e.g., transducers), a 2-way motor controlled valve 412, a 3-way motor controlled valve 414, a centrifugal circulation pump 416, a 3-way bypass valve 418, a bypass/relief service valve 420, and a pressure relief valve 422.

In some instances, the chiller 402, the temperature 408 and pressure 410 instrumentation, and the centrifugal pump 416 can be combined with a cold water tank 424 to form a cooling system 430. In other instances, the heater 406, the temperature 408 and pressure 410 instrumentation, and the centrifugal pump 416 can be combined with a hot water tank 426 to form a heating system 432.

The fluid from the chiller 402 and the heater 406 can flow through the 3-way motor controlled valve 414 into the feed pump 404. The fluid can then flow through the bypass/relief service valve 420 or the pressure relief valve 422 and through the 3-way bypass valve 418. The fluid can then flow through another temperature 408 and pressure 410 instrumentation and into an input of a plate 428. From the output of the plate 428, the fluid can flow through a different temperature 408 and pressure 410 instrumentation, through the 2-way motor controlled valves 412, and into the cooling system 430/heating system 432.

FIG. 8 illustrates an example table of components of a thermal shock testing system 300, 400, according to some aspects of the disclosed technology. In some instances, a power on/off temperature difference can be a factor that drives a temperature change impact on the components on the compute board (e.g., UUT). Some of the equipment parts/components of the LCS liquid-to-liquid thermal shock testing system 300, 400 are listed in the table of FIG. 8. The chiller (cold) 302 can provide a temperature range approximately between −25 degrees Celsius and 15 degrees Celsius. The chiller (hot) 304 can provide a temperature range approximately between 25 degrees Celsius and 90 degrees Celsius. The valves 314 can provide/tolerate a temperature range approximately between −25 degrees Celsius and 95 degrees Celsius. The chamber 306 (e.g., an environmental chamber) can tolerate a temperature range approximately between −25 degrees Celsius and 125 degrees Celsius. The chamber 306 also can include dry nitrogen purging gas capabilities to minimize surface condensation. The thermal shock testing system 300, 400 also can include a pressure transducer 332 (e.g., 0-1 MPa). The thermal shock testing system 300, 400 can further include a temperature transducer 330 (e.g., −50 degrees Celsius to 120 degrees Celsius).

FIG. 9 illustrates an example table of parameters of a thermal shock testing system 300, 400, according to some aspects of the disclosed technology. An example of thermal shock testing parameters is shown in FIG. 9, which include a temperature range between −20 degrees Celsius and 85 degrees Celsius. The temperature range can be modified to be suitable for the intended purpose and understood by a person of ordinary skill in the art.

In some embodiments, the thermal shock testing system parameters can include 50 cycles, a maximum temperature of 85 degrees Celsius, a minimum temperature of −25 degrees Celsius, a ramp rate of less than 10 seconds, a dwell time of 30 minutes at the maximum temperature and the minimum temperature, a UUT ambient temperature between −20 degrees Celsius and 50 degrees Celsius, and a UUT power on/off option.

In some instances, the chamber 306 of the thermal shock testing system 300 can include a dry nitrogen purging gas to provide a non-condensing transition from one test level (e.g., temperature) to another. The purging gas also can be carbon dioxide or any other purging gas suitable for the intended purpose and understood by a person of ordinary skill in the art to sustain a non-condensing environment during the thermal shock test for a non-frost thermal shock. If a frost condition is needed as an additional condensation test parameter (in parallel with the thermal shock), the dry nitrogen purging gas may not be used. As such, in some instances, the thermal shock testing system 300, 400 can include two liquid-to-liquid thermal shock tests, one without surface condensation and one with surface condensation.

Figure 10:
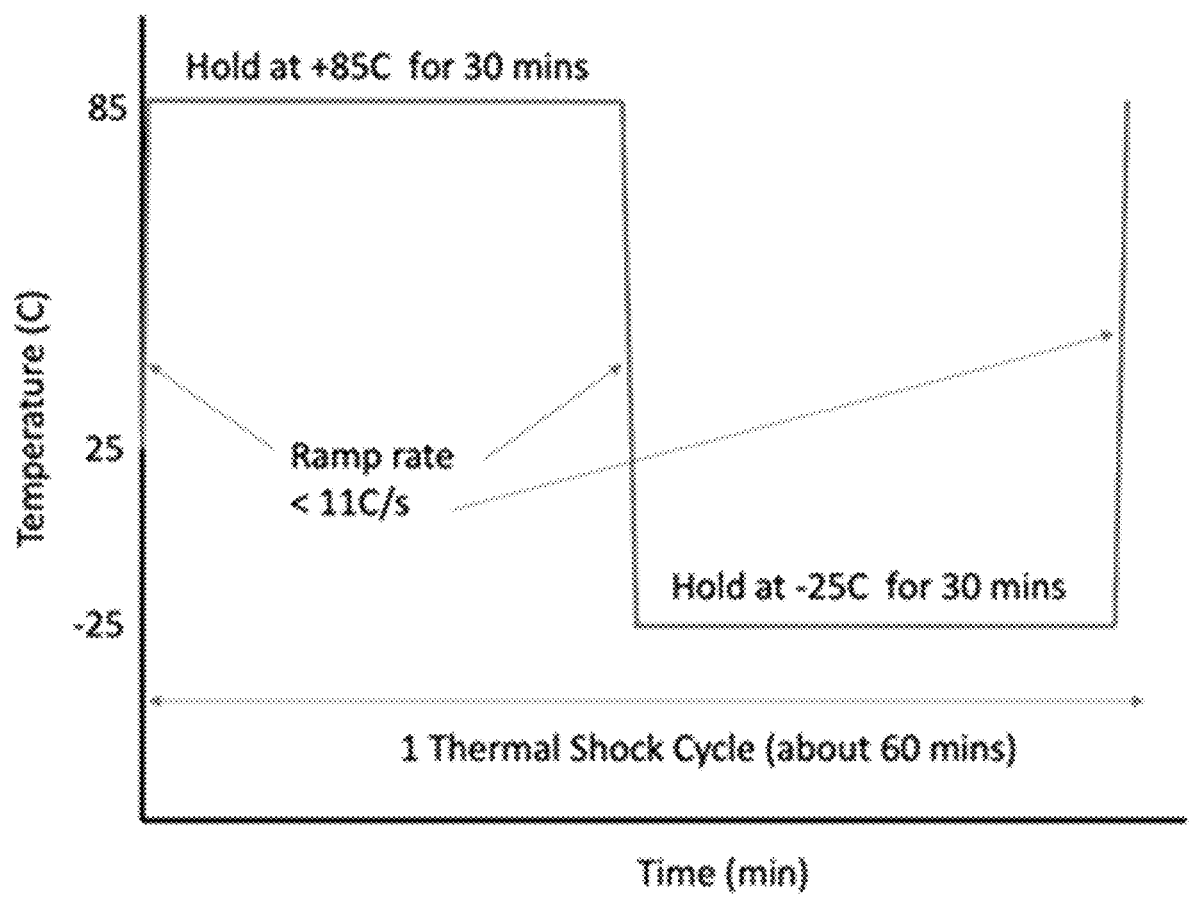
FIG. 10 illustrates an example thermal shock temperature profile of a thermal shock testing system, according to some aspects of the disclosed technology.

FIG. 10 illustrates an example thermal shock temperature profile of a thermal shock testing system 300, 400, according to some aspects of the disclosed technology. An example test procedure is provided below:

Liquid-to-liquid non-operational or operational thermal shock without UUT surface condensation:
1) Perform a functional, cosmetic, and dimensional inspection of the UUT.
2) Place the UUT in the chamber 306 of the thermal shock testing system 300, 400, set the chamber temperature to 25 degrees Celsius with uncontrolled humidity, and start nitrogen gas (N2) purging.
3) Set the chiller 302, 402 to the desired temperature (Tmin) and the boiler 304, 406 to the desired temperature (Tmax).
4) Begin cycling at room temperature. Turn on the hot coolant valve 314, 414.
5) Allow the UUT to dwell at the high temperature (85 degrees Celsius) for the set dwell time (30 minutes).
6) Turn off the hot coolant valve 314, 414 and turn on the cold coolant valve 314, 414 (ramp rate of less than 11 degrees Celsius/second).
7) Allow the UUT to dwell at the low temperature (−25 degrees Celsius) for the set dwell time (30 minutes).
8) Repeat steps 4 through 7 for the set number of cycles.
9) Perform a baseline functional, cosmetic, and dimensional inspection to determine whether any changes or abnormalities occurred during the thermal shock test.

Liquid-to-liquid operational thermal shock without UUT surface condensation:
1) Perform a baseline functional, cosmetic, and dimensional inspection of the UUT.
2) Install a thermocouple at the specific component location, if required.
3) Place the UUT in the chamber 306 of the thermal shock testing system 300, 400, set the chamber temperature to 25 degrees Celsius with uncontrolled humidity, and start nitrogen gas (N2) purging.
4) Boot the UUT and start diagnostic software. Allow the UUT to successfully pass 2 complete cycles of the diagnostics before continuing. Continue running the diagnostic software during the entire thermal shock cycle.
5) Set the chiller 302, 402 to the desired temperature (Tmin) and the boiler 304, 406 to the desired temperature (Tmax).
6) Begin cycling at room temperature. Turn on the hot coolant valve 314, 414.
7) Allow the UUT to dwell at the high temperature (85 degrees Celsius) for the set dwell time (30 minutes).

8) Turn off the hot coolant valve 314, 414 and turn on the cold coolant valve 314, 414 (ramp rate of less than 11 degrees Celsius/second).
9) Allow the UUT to dwell at the low temperature (−25 degrees Celsius) for the set dwell time (30 minutes).
10) Repeat steps 5 through 9 for the number of cycles. Monitor the UUT to determine if the diagnostic software reports any failures.
11) Perform a baseline functional, cosmetic, and dimensional inspection to determine whether any changes or abnormalities occurred during the thermal shock test.

Figure 11:
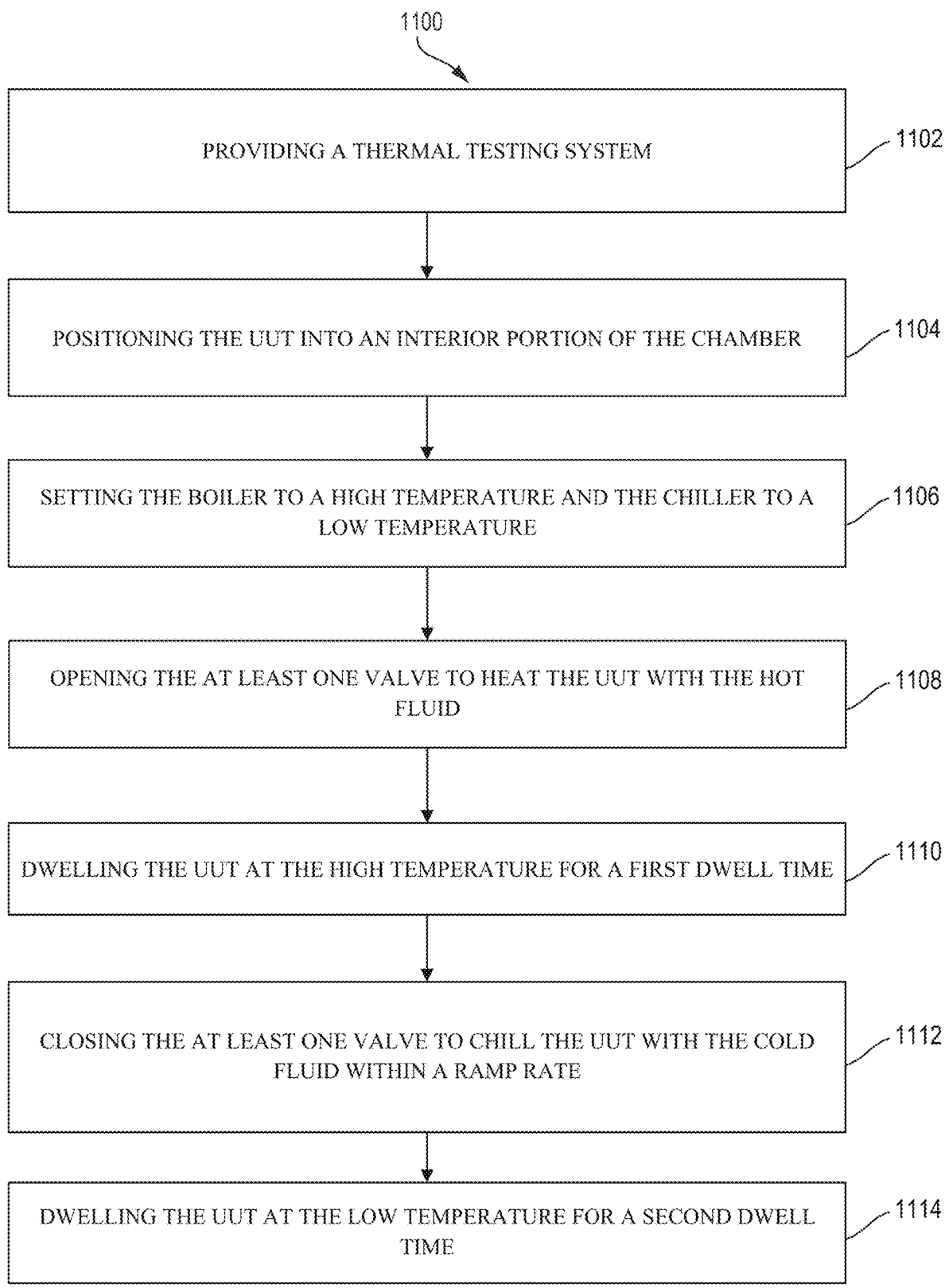
FIG. 11 illustrates an example process for providing a thermal shock to a unit-under-test, according to some aspects of the disclosed technology.

Having disclosed some example system components and concepts, the disclosure now turns to FIG. 11, which illustrate example method 1100 for providing a thermal shock to a unit-under-test. The steps outlined herein are exemplary and can be implemented in any combination thereof, including combinations that exclude, add, or modify certain steps.

The thermal shock testing system can include a computer-implemented control algorithm for directing the coolant hot and cold thermal shock. The computer-implemented control algorithm can include switching to a hot loop, turning on a pump, turning the pump off when a target time has been reached, switching to a cold loop, turning on the pump, turning the pump off when a target time has been reached, and repeating the above steps until a specified target number of cycles has been reached.

At step 1102, the method 1100 can include providing a thermal testing system to test a unit-under-test (UUT) with a thermal shock. For example, providing a thermal testing system comprising: a chamber having an inlet and an outlet, the chamber being configured to provide a thermal shock to a unit-under-test (UUT), a pump configured to fluidly connect to the inlet of the chamber and direct a temperature controlled liquid through a channel embedded in the chamber, and a boiler and a chiller fluidly connected to the pump, the temperature of the liquid being controlled by at least one valve configured to alternatively direct hot or cold fluid to the inlet of the chamber.

At step 1104, the method 1100 can include positioning the UUT into an interior portion of the chamber.

At step 1106, the method 1100 can include setting the boiler to a high temperature and the chiller to a low temperature.

At step 1108, the method 1100 can include opening the at least one valve to heat the UUT with the hot fluid.

At step 1110, the method 1100 can include dwelling the UUT at the high temperature for a first dwell time.

At step 1112, the method 1100 can include closing the at least one valve to chill the UUT with the cold fluid within a ramp rate.

At step 1114, the method 1100 can include dwelling the UUT at the low temperature for a second dwell time.

The method 1100 also can include booting the UUT and starting a diagnostic test to monitor the UUT during the thermal shock test. The method 1100 further can include the ramp rate being approximately 11 degrees Celsius per second. The method 1100 additionally can include the first dwell time and the second dwell time being approximately 30 minutes.

In some instances, the method 1100 can further include the chamber being configured to receive the UUT. The channel can be embedded within an outer casing surrounding the chamber. The chamber can be within an outer casing of a liquid cooling system of an autonomous vehicle. The UUT can be a compute of an autonomous vehicle. The thermal testing system can further comprise: a first temperature transducer and a first pressure transducer that are connected to the inlet of the chamber, and a second temperature transducer and a second pressure transducer that are connected to the outlet of the chamber. The thermal testing system can further comprise a bypass valve between the inlet and the outlet of the chamber to maintain the temperature in the channel when the UUT is not connected to the chamber. The hot fluid can be approximately 85 degrees Celsius and the cold fluid is approximately −25 degrees Celsius. The thermal testing system can further comprises a plurality of channels, a first channel of the plurality of channels including a first coil configured to adjust a temperature of a first portion of the chamber, and a second channel of the plurality of channels including a second coil configured to adjust a temperature of a second portion of the chamber. The first coil of the first channel can provide a different temperature than the second coil of the second channel.

Figure 12:
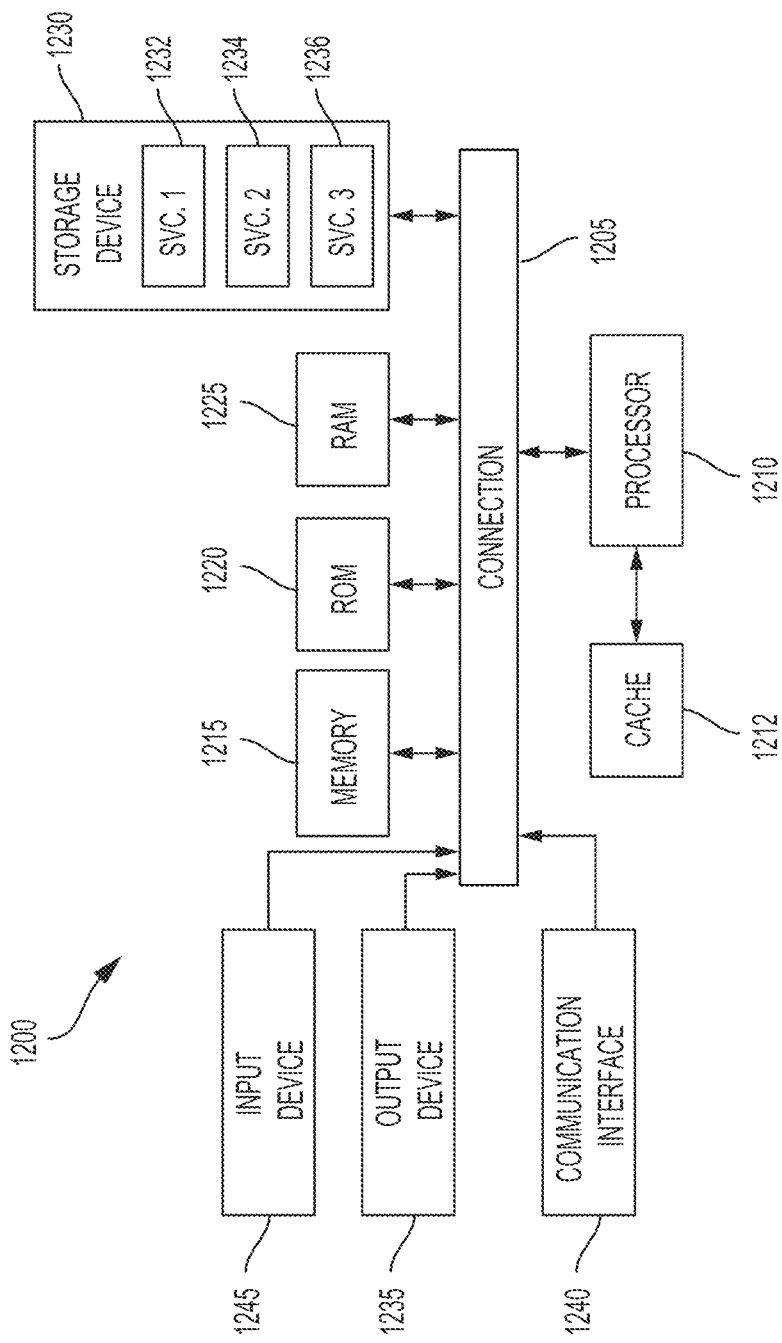
FIG. 12 illustrates an example processor-based system with which some aspects of the subject technology can be implemented.

FIG. 12 illustrates an example computing system 1200 which can be, for example, any computing device making up internal computing system 110, remote computing system 150, a passenger device executing rideshare application 170, or any other computing device. In FIG. 12, the components of the computing system 1200 are in communication with each other using connection 1205. Connection 1205 can be a physical connection via a bus, or a direct connection into processor 1210, such as in a chipset architecture. Connection 1205 can also be a virtual connection, networked connection, or logical connection.

In some embodiments, computing system 1200 is a distributed system in which the functions described in this disclosure can be distributed within a datacenter, multiple data centers, a peer network, etc. In some embodiments, one or more of the described system components represents many such components each performing some or all of the function for which the component is described. In some embodiments, the components can be physical or virtual devices.

Example system 1200 includes at least one processing unit (CPU or processor) 1210 and connection 1205 that couples various system components including system memory 1215, such as read-only memory (ROM) 1220 and random access memory (RAM) 1225 to processor 1210. Computing system 1200 can include a cache of high-speed memory 1212 connected directly with, in close proximity to, or integrated as part of processor 1210.

Processor 1210 can include any general purpose processor and a hardware service or software service, such as services 1232, 1234, and 1236 stored in storage device 1230, configured to control processor 1210 as well as a special-purpose processor where software instructions are incorporated into the actual processor design. Processor 1210 may essentially be a completely self-contained computing system, containing multiple cores or processors, a bus, memory controller, cache, etc. A multi-core processor may be symmetric or asymmetric.

To enable user interaction, computing system 1200 includes an input device 1245, which can represent any number of input mechanisms, such as a microphone for speech, a touch-sensitive screen for gesture or graphical input, keyboard, mouse, motion input, speech, etc. Computing system 1200 can also include output device 1235, which can be one or more of a number of output mechanisms known to those of skill in the art. In some instances, multimodal systems can enable a user to provide multiple types of input/output to communicate with computing system 1200. Computing system 1200 can include communications interface 1240, which can generally govern and manage the user input and system output. There is no restriction on operating on any particular hardware arrangement, and therefore the basic features here may easily be substituted for improved hardware or firmware arrangements as they are developed.

Storage device 1230 can be a non-volatile memory device and can be a hard disk or other types of computer readable media which can store data that are accessible by a computer, such as magnetic cassettes, flash memory cards, solid state memory devices, digital versatile disks, cartridges, random access memories (RAMs), read-only memory (ROM), and/or some combination of these devices.

The storage device 1230 can include software services, servers, services, etc., that when the code that defines such software is executed by the processor 1210, it causes the system to perform a function. In some embodiments, a hardware service that performs a particular function can include the software component stored in a computer-readable medium in connection with the necessary hardware components, such as processor 1210, connection 1205, output device 1235, etc., to carry out the function.

For clarity of explanation, in some instances, the present technology may be presented as including individual functional blocks including functional blocks comprising devices, device components, steps or routines in a method embodied in software, or combinations of hardware and software.

Any of the steps, operations, functions, or processes described herein may be performed or implemented by a combination of hardware and software services or services, alone or in combination with other devices. In some embodiments, a service can be software that resides in memory of a client device and/or one or more servers of a content management system and perform one or more functions when a processor executes the software associated with the service. In some embodiments, a service is a program or a collection of programs that carry out a specific function. In some embodiments, a service can be considered a server. The memory can be a non-transitory computer-readable medium.

In some embodiments, the computer-readable storage devices, mediums, and memories can include a cable or wireless signal containing a bit stream and the like. However, when mentioned, non-transitory computer-readable storage media expressly exclude media such as energy, carrier signals, electromagnetic waves, and signals per se.

Methods according to the above-described examples can be implemented using computer-executable instructions that are stored or otherwise available from computer-readable media. Such instructions can comprise, for example, instructions and data which cause or otherwise configure a general purpose computer, special purpose computer, or special purpose processing device to perform a certain function or group of functions. Portions of computer resources used can be accessible over a network. The executable computer instructions may be, for example, binaries, intermediate format instructions such as assembly language, firmware, or source code. Examples of computer-readable media that may be used to store instructions, information used, and/or information created during methods according to described examples include magnetic or optical disks, solid-state memory devices, flash memory, USB devices provided with non-volatile memory, networked storage devices, and so on.

Devices implementing methods according to these disclosures can comprise hardware, firmware and/or software, and can take any of a variety of form factors. Typical examples of such form factors include servers, laptops, smartphones, small form factor personal computers, personal digital assistants, and so on. The functionality described herein also can be embodied in peripherals or add-in cards. Such functionality can also be implemented on a circuit board among different chips or different processes executing in a single device, by way of further example.

The instructions, media for conveying such instructions, computing resources for executing them, and other structures for supporting such computing resources are means for providing the functions described in these disclosures.

Although a variety of examples and other information was used to explain aspects within the scope of the appended claims, no limitation of the claims should be implied based on particular features or arrangements in such examples, as one of ordinary skill would be able to use these examples to derive a wide variety of implementations. Further and although some subject matter may have been described in language specific to examples of structural features and/or method steps, it is to be understood that the subject matter defined in the appended claims is not necessarily limited to these described features or acts. For example, such functionality can be distributed differently or performed in components other than those identified herein. Rather, the described features and steps are disclosed as examples of components of systems and methods within the scope of the appended claims.

Claim language reciting "at least one of" a set indicates that one member of the set or multiple members of the set satisfy the claim. For example, claim language reciting "at least one of A and B" means A, B, or A and B.

What is claimed is:

1. A thermal testing system comprising:
   a chamber having an inlet and an outlet, the chamber being configured to provide a thermal shock to a unit-under-test (UUT);
   a pump configured to fluidly connect to the inlet of the chamber and direct a temperature controlled liquid through a channel embedded in the chamber; and
   a boiler and a chiller fluidly connected to the pump, the temperature of the liquid being controlled by at least one valve configured to alternatively direct hot or cold fluid to the inlet of the chamber.

2. The thermal testing system of claim 1, wherein the chamber is configured to receive the UUT.

3. The thermal testing system of claim 1, wherein the channel is embedded within an outer casing surrounding the chamber.

4. The thermal testing system of claim 1, wherein the chamber is within an outer casing of a liquid cooling system of an autonomous vehicle.

5. The thermal testing system of claim 1, wherein the UUT is a compute of an autonomous vehicle.

6. The thermal testing system of claim 1, further comprising:
   a first temperature transducer and a first pressure transducer that are connected to the inlet of the chamber; and
   a second temperature transducer and a second pressure transducer that are connected to the outlet of the chamber.

7. The thermal testing system of claim 1, further comprising a bypass valve between the inlet and the outlet of the chamber to maintain the temperature in the channel when the UUT is not connected to the chamber.

8. The thermal testing system of claim 1, wherein the hot fluid is approximately 85 degrees Celsius and the cold fluid is approximately −25 degrees Celsius.

9. The thermal testing system of claim 1, further comprising a plurality of channels, a first channel of the plurality of channels including a first coil configured to adjust a temperature of a first portion of the chamber, and a second channel of the plurality of channels including a second coil configured to adjust a temperature of a second portion of the chamber.

10. The thermal testing system of claim 9, wherein the first coil of the first channel provides a different temperature than the second coil of the second channel.

11. A method comprising:
providing a thermal testing system comprising:
  a chamber having an inlet and an outlet, the chamber being configured to provide a thermal shock to a unit-under-test (UUT);
  a pump configured to fluidly connect to the inlet of the chamber and direct a temperature controlled liquid through a channel embedded in the chamber; and
  a boiler and a chiller fluidly connected to the pump, the temperature of the liquid being controlled by at least one valve configured to alternatively direct hot or cold fluid to the inlet of the chamber;
positioning the UUT into an interior portion of the chamber;
setting the boiler to a high temperature and the chiller to a low temperature;
opening the at least one valve to heat the UUT with the hot fluid;
dwelling the UUT at the high temperature for a first dwell time;
closing the at least one valve to chill the UUT with the cold fluid within a ramp rate; and
dwelling the UUT at the low temperature for a second dwell time.

12. The method of claim 11, wherein the chamber is configured to receive the UUT.

13. The method of claim 11, wherein the channel is embedded within an outer casing surrounding the chamber.

14. The method of claim 11, wherein the chamber is within an outer casing of a liquid cooling system of an autonomous vehicle.

15. The method of claim 11, wherein the UUT is a compute of an autonomous vehicle.

16. The method of claim 11, wherein the thermal testing system further comprises:
  a first temperature transducer and a first pressure transducer that are connected to the inlet of the chamber; and
  a second temperature transducer and a second pressure transducer that are connected to the outlet of the chamber.

17. The method of claim 11, wherein the thermal testing system further comprises a bypass valve between the inlet and the outlet of the chamber to maintain the temperature in the channel when the UUT is not connected to the chamber.

18. The method of claim 11, wherein the hot fluid is approximately 85 degrees Celsius and the cold fluid is approximately −25 degrees Celsius.

19. The method of claim 11, wherein the thermal testing system further comprises a plurality of channels, a first channel of the plurality of channels including a first coil configured to adjust a temperature of a first portion of the chamber, and a second channel of the plurality of channels including a second coil configured to adjust a temperature of a second portion of the chamber.

20. The method of claim 19, wherein the first coil of the first channel provides a different temperature than the second coil of the second channel.

* * * * *